United States Patent
Zhang et al.

(10) Patent No.: US 8,957,523 B2
(45) Date of Patent: Feb. 17, 2015

(54) DIELECTRIC POSTS IN METAL LAYERS

(71) Applicant: GLOBALFOUNDRIES Singapore Pte. Ltd., Singapore (SG)

(72) Inventors: Fan Zhang, Singapore (SG); Wei Shao, Singapore (SG); Juan Boon Tan, Singapore (SG); Yeow Kheng Lim, Singapore (SG); Mahesh Bhatkar, Singapore (SG); Soh Yun Siah, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 4 days.

(21) Appl. No.: 13/737,957

(22) Filed: Jan. 10, 2013

(65) Prior Publication Data

US 2014/0191407 A1 Jul. 10, 2014

(51) Int. Cl.
*H01L 23/52* (2006.01)
*H01L 23/00* (2006.01)
*H01L 23/538* (2006.01)
*H01L 23/58* (2006.01)

(52) U.S. Cl.
CPC .......... *H01L 23/562* (2013.01); *H01L 23/5384* (2013.01); *H01L 23/585* (2013.01); *H01L 2924/0002* (2013.01)
USPC ........... 257/773; 257/750; 257/758; 257/759; 257/774; 257/775; 257/E21.575

(58) Field of Classification Search
USPC ................ 257/750, 758, 774, 759, 773, 775, 257/E21.507, E21.575
See application file for complete search history.

(56) References Cited

U.S. PATENT DOCUMENTS

| | | | |
|---|---|---|---|
| 6,693,357 B1 | 2/2004 | Borst et al. | |
| 7,900,177 B2 | 3/2011 | Hirabayashi | |
| 2009/0132082 A1* | 5/2009 | Cho et al. | 700/121 |
| 2012/0074519 A1* | 3/2012 | Yeo et al. | 257/508 |

* cited by examiner

*Primary Examiner* — Jasmine Clark
(74) *Attorney, Agent, or Firm* — Horizon IP Pte Ltd

(57) ABSTRACT

A semiconductor device is disclosed. The semiconductor device includes a substrate comprises a plurality of metal layers. The semiconductor device also includes dielectric posts disposed in the metal layers. The density of the dielectric posts in the metal layers is equal to about 15-25%.

20 Claims, 4 Drawing Sheets

DIELECTRIC POSTS IN METAL LAYERS

BACKGROUND

Fabrication of integrated circuits (ICs) involves the formation of features on a substrate that make up circuit components, such as transistors, resistors and capacitors. The components are interconnected, enabling the IC to perform the desired functions. Interconnections are formed by forming contacts and conductive lines in a dielectric layer using, for example, damascene techniques. A damascene structure, for example, includes a via or contact hole in a lower portion and a trench which is generally wider than the contact hole in an upper portion. The via serves as a contact to a component while the trench contains the conductive line for connecting the component to, for example, other component.

To increase throughput, a plurality of ICs are fabricated on a wafer in parallel. The ICs are separated into individual chips in a process typically referred to as "dicing". Due to the properties of the typical dielectric layer, cracks propagate from the area where dicing tool cuts the wafer into the active chip areas, causing reliability and yield issues. Therefore, crack-stop regions are introduced to reduce the crack propagation during dicing. However, the stress generated by metal lines often causes delamination of the metal lines in the crack-stop regions.

From the foregoing discussion, it is desirable to prevent delamination of metal lines at the crack-stop (CS) regions.

SUMMARY

A semiconductor device is disclosed. In one embodiment, the semiconductor device includes a substrate comprises a plurality of metal layers. The semiconductor device also includes dielectric posts disposed in the metal layers. The density of the dielectric posts in the metal layers is equal to about 15-25%.

In one embodiment, a semiconductor device is disclosed. The semiconductor device includes a substrate comprises a plurality of metal levels having metal layers disposed in a crack stop region. The semiconductor device also includes dielectric posts disposed in the metal layers. The density of the dielectric posts in the metal layers is equal to about 15-25%.

In yet another embodiment, a semiconductor device is disclosed. The semiconductor device includes a substrate prepared with circuit components formed thereon. The substrate has a crack-stop region disposed in a peripheral region of the circuit components. The semiconductor device also includes a plurality of metal layers disposed in the crack-stop region. The semiconductor device further includes dielectric posts disposed in the metal layers. The density of the dielectric posts in the metal layers is equal to about 15-25%.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relates to devices, such as semiconductor devices or ICs. Other types of devices, such as micro electro-mechanical systems (MEMS), liquid crystal displays, are also useful. The ICs can be any type of IC, for example dynamic or static random access memories, signal processors, or system-on-chip devices. The ICs can be incorporated into, for example, consumer electronic products, such as computers, cell phones, and personal digital assistants (PDAs).

Figure 1:
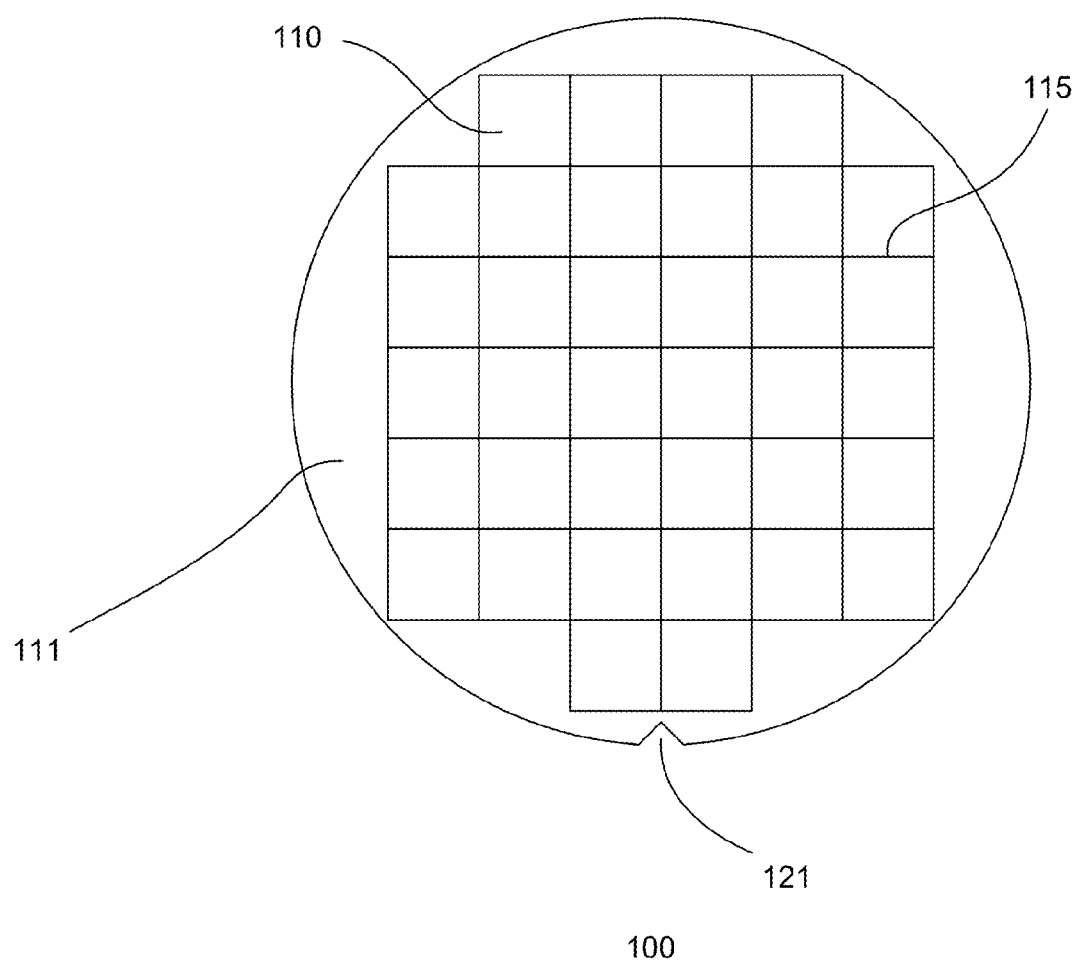
FIG. 1 shows a plan view of a semiconductor wafer.

FIG. 1 shows a semiconductor wafer 100. The semiconductor wafer, for example, comprises a silicon wafer. Other types of wafers are also useful. For example, the wafer may be a p-type, n-type, silicon-on-insulator or silicon germanium wafer. Depending on the type of device, the wafer may comprise a non-semiconductor material. The wafer may include a notch 121 to indicate the crystal orientation of the wafer. Other techniques for indicating the crystal orientation may also be useful. Additional indicators may also be included to indicate the dopant type of the wafer.

The wafer includes an active surface 111 on which devices 110 are formed. A plurality of devices, such as ICs, may be formed on the wafer in parallel. The devices, for example, are arranged in rows along a first (x) direction and columns along a second (y) direction. The devices are separated by scribe lines or regions 115 in the first and second directions. After processing of the wafer is completed, a dicing tool cuts the wafer along the scribe lines to singulate the devices. The devices may be further processed, such as assembly and testing to complete the devices.

Figure 2:
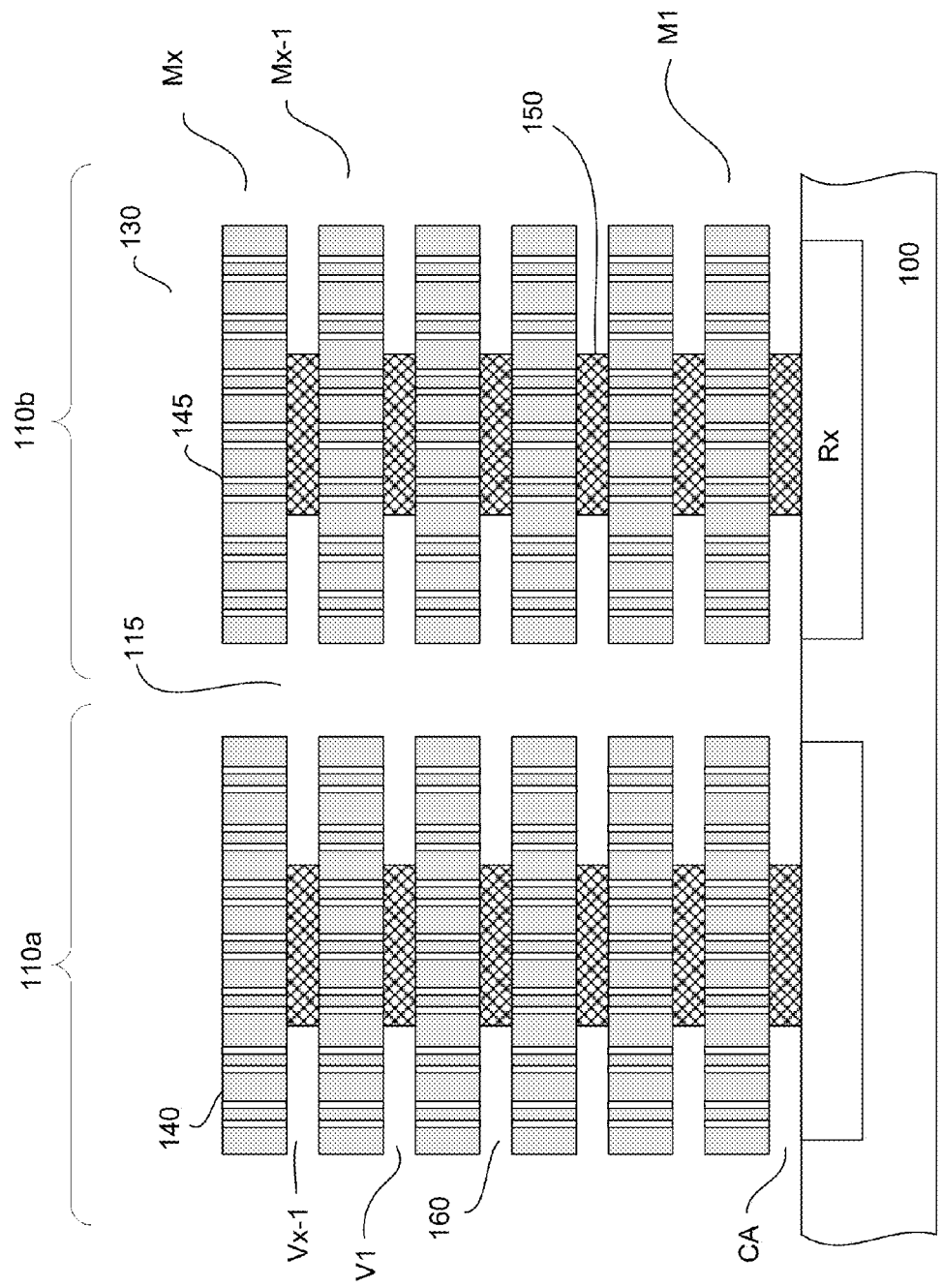
FIG. 2 shows cross-sectional view of portion of a semiconductor wafer.

FIG. 2 shows a cross-sectional view of a portion 200 of the wafer 100. The wafer is processed with devices. The wafer portion shown includes peripheral portions of first and second devices 110a-b separated by a scribe region 115. For example, the peripheral region surrounds the main region.

The main region includes circuit components (not shown) formed in and/or on the substrate. The circuit components, for example, may include transistors as well as other components. The circuit components may be interconnected by interconnects formed in metal or interconnect levels M1-Mx. Contacts may be used to couple interconnects of, for example, adjacent metal levels or interconnects to the circuit components. The contact level that couples circuit components' interconnects of the first metal level M1 is referred to as CA, while other contact levels disposed between adjacent metal levels are via levels V1-Vx-1. Typically, a device may have about 3-7 (e.g., x=3-7) metal levels. Providing devices with other number of metal levels may also be useful.

The contacts and interconnects are disposed in a dielectric material 160. The dielectric material, for example, may include a plurality of dielectric layers which serve as inter-level dielectric (ILD) layers. Etch stop layers may be provided between ILD layers. Other configuration of ILD or dielectric layers may also be useful.

The contacts and interconnects may be formed by damascene or dual damascene techniques. Damascene technique includes forming openings in a dielectric layer which are filled with conductive material. Excess conductive material is removed by, for example, polishing. This forms contacts in the contact level or interconnects in the interconnect level. Dual damascene technique includes forming in the dielectric layer both openings corresponding to contact openings and trench openings corresponding to interconnects, which are filled by a conductive material. Excess conductive material is removed by, for example, polishing. This forms contacts and interconnect in a single process.

In some cases, the contacts and interconnects may be formed by a combination of damascene and dual damascene techniques. For example, the CA and M1 levels are formed using damascene techniques while the other levels are formed using dual damascene techniques. Other techniques or combination of techniques may be employed to form the contact and interconnect levels. In the case of a dual damascene process, the conductive material of the contacts and interconnects are the same. On the other hand, damascene processes allow for the use of different conductive materials for contacts and interconnects. The interconnects and contacts for the upper metal levels (e.g., M1–Mx and V1–Vx–1) may be copper or copper alloy while tungsten may be used for contacts in the CA level. Other configuration of contact and interconnect materials may also be useful.

A crack stop 130 is disposed in the peripheral region of a device. The crack stop surrounds the main region. The crack stop serves as a barrier to prevent the propagation of cracks caused by dicing the wafer into the main region. The propagation of cracks into the main region may damage to the device, rendering it defective. In some embodiments, a moisture barrier (not shown) may be provided between the crack stop and main region.

The crack stop is formed of a conductive material of the metal and contact levels. For example, the crack stop is formed using the same processes for forming contacts and interconnects in the different contact and metal levels. To form the crack stop, the various photomasks or reticles used to form the contact and metal levels include the pattern in the peripheral region for crack stop.

The metal levels M1–Mx of the crack stop includes wide metal lines 140. The wide metal lines, for example, are sufficiently wide to serve as effective crack stops. The wide metal lines may be, for example, about 4.5 to 7 µm wide. Providing wide metal lines of other widths may also be useful. For example, the wide metal lines may be wider than 7 µm. The widths of the wide metal line may depend on, for example, design requirements. In one embodiment, the wide metal lines at different metal levels have about the same width and are in registration. Providing wide metal lines at different levels having other configurations may also be useful. For example, the wide metal lines at different levels may have different widths.

As for the contact levels CA and V1–Vx, they include contact or via bars 150. A contact or via bar is a continuous conductive barrier disposed in a contact level. In one embodiment, a via bar is a continuous non-solid conductive barrier. For example, a via bar may be a net like structure which form a continuous non-solid conductive barrier. In one embodiment, a via bar may have a mesh-like structure, a line structure which forms a grid. Other types of continuous non-solid patterns for the via bars may also be useful. Providing a continuous non-solid via bar prevents moisture intrusion and out-gassing and enhances the strength of the crack stop.

In one embodiment, the via bars are narrower than the wide metal lines. The via bars may be, for example, about 50-500 nm wide. The via bars at the various contact levels may be of the same width. Providing via bars of different widths may also be useful. It is understood that the via bars at the different levels need not be the same or have the same design. In one embodiment, the via bars include multiple types via bars. For example, via bars at lower metal levels may have a mesh design while via bars at the top or upper levels may have a line design.

As shown, a wide metal line Mx is disposed at the top of the crack stop. In some embodiments, a contact bar (not shown) may be disposed over the top wide metal line. Other configurations of contact bars and metal lines for the crack stop may also be useful.

In one embodiment, dielectric posts 145 are distributed throughout the wide metal lines of the crack stop of all metal levels, creating what may be referred to as "cheesing" in the wide metal lines. For example, wide metal lines of M1–Mx are provided with cheesing. The dielectric posts, for example, extend the thickness of the wide metal lines. The density of the cheesing is sufficient to alleviate stress generated by the wide metal lines to reduce or prevent peeling. The cheesing density should not exceed a threshold which would degrade the crack stop's ability to serve as a crack stop. In one embodiment, the cheesing density is about 15-25%.

In one embodiment, the dielectric posts do not come into contact or communicate with the conductive parts of the via bars above and below the wide metal lines. In one embodiment, at least some of the wide metal lines have via bars above and below which have the same pattern and are in registration. This provides a larger area for distributing the dielectric posts in the wide metal line. Providing via bars above and below the wide metal lines having different patterns may also be useful. For example, in the upper metal levels, the upper via bar may have a line design while the lower via bar may have a mesh design.

The dielectric posts may be provided in a metal line by, for example, forming the trench corresponding to a metal line to include the posts. The trench may be filled by conductive material, followed by a planarization process to form the metal line with dielectric posts. The process can easily be extended to dual damascene processes which the metal line and via bar are formed together. Other techniques to provide cheesing may also be useful.

Figure 3A:
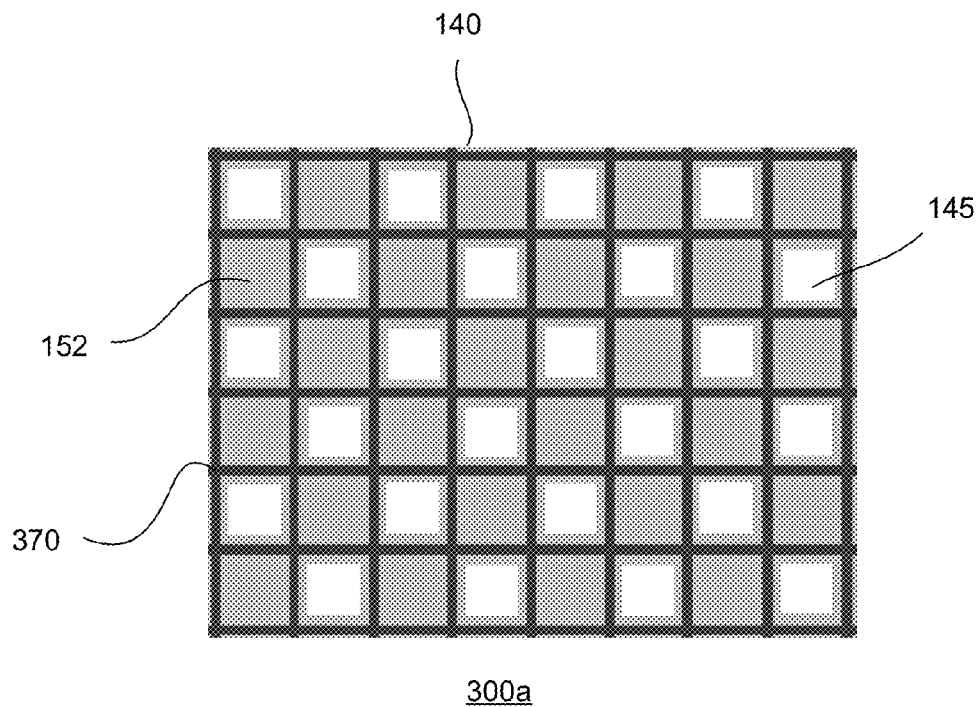
FIGS. 3a-b show plan views of an embodiment of cheesing in wide metal lines.
Figure 3B:
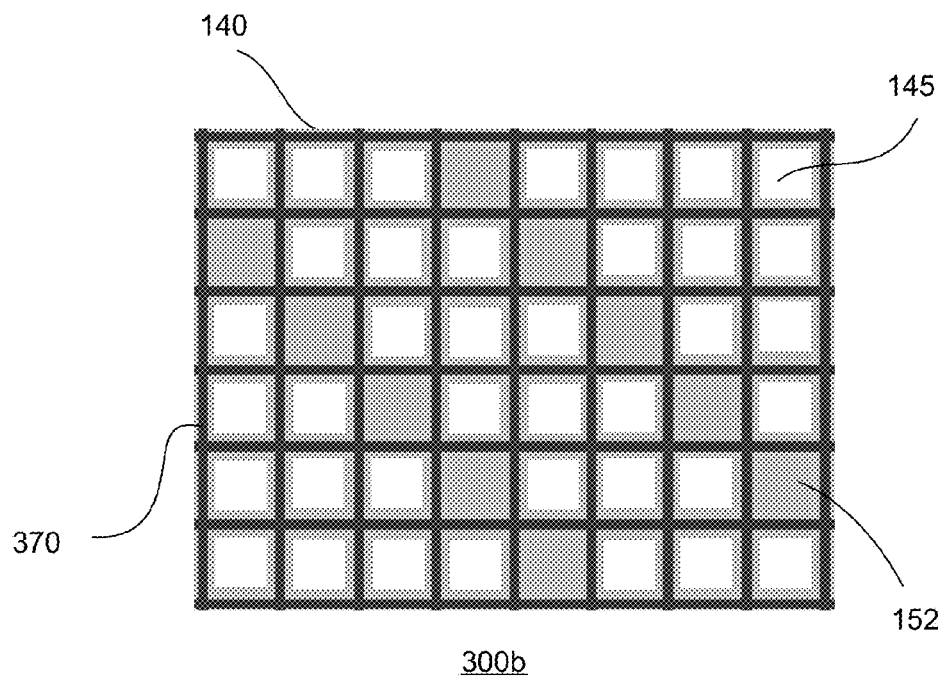

FIGS. 3a-b show plan views of an embodiment of cheesing having different densities in wide metal lines used in crack stop. Referring to FIGS. 3a-b, a plan view of a portion of a metal line 140 is shown. The metal line, for example, may be a wide metal line of a crack stop. A via bar 370, for example, is disposed over the wide metal line. The via bar, in one embodiment, has a mesh design. The mesh design, for example, includes a series of intersecting first lines in a first direction along a width of the metal line and second lines in a second direction along a length of the metal line. As shown, the mesh includes cells formed by intersections of first and second lines. The cells, as shown, are uniform sized squared shape cells. Other types of mesh patterns may also be useful. For example, the mesh may have non-uniform geometric shapes and/or non-uniform sized cells. In one embodiment, width of the lines forming the mesh may be about 0.05-0.20 µm wide. Providing other widths for the lines may also be useful. The mesh design via bar, for example, may be disposed above and below any metal level except the top metal line of the crack stop. Other configurations of the mesh design via bar and metal levels may also be useful.

The metal line includes dielectric posts 145 which form a cheesing pattern. The density of the cheesing is sufficient to reduce or prevent delamination caused by the stress of the wide metal lines. As shown, the cheesing pattern in FIG. 3a has lower density than the cheesing pattern in FIG. 3b. In one embodiment, a dielectric post is disposed within lines of a cell of the via bar. A dielectric post, for example, is disposed substantially within the lines of a cell and does not come into contact with the lines of the cell. As shown, not all cells include dielectric posts. The dielectric posts may be uniformly distributed through the metal line, as shown in FIG. 3a or non-uniformly, as shown in FIG. 3b. The metal line includes a non-cheesing area 152 devoid of dielectric posts. The non-cheesing area, in one embodiment, corresponds to where the via bar contacts the wide metal line. For example, the pattern of the dielectric cheesing avoids contact with the via bar above. The pattern of the dielectric cheesing also avoids contact or communication with the via bar below. As discussed, the via bar above and below need not have the same design.

Figure 4A:
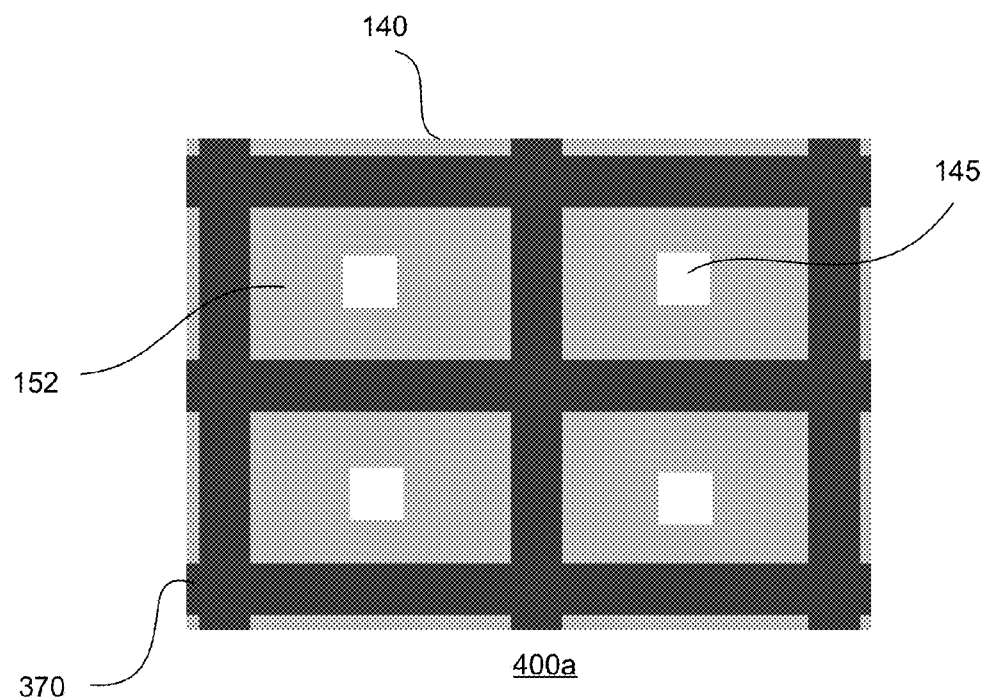
FIGS. 4a-b show plan views of other embodiments of cheesing in wide metal lines.
Figure 4B:
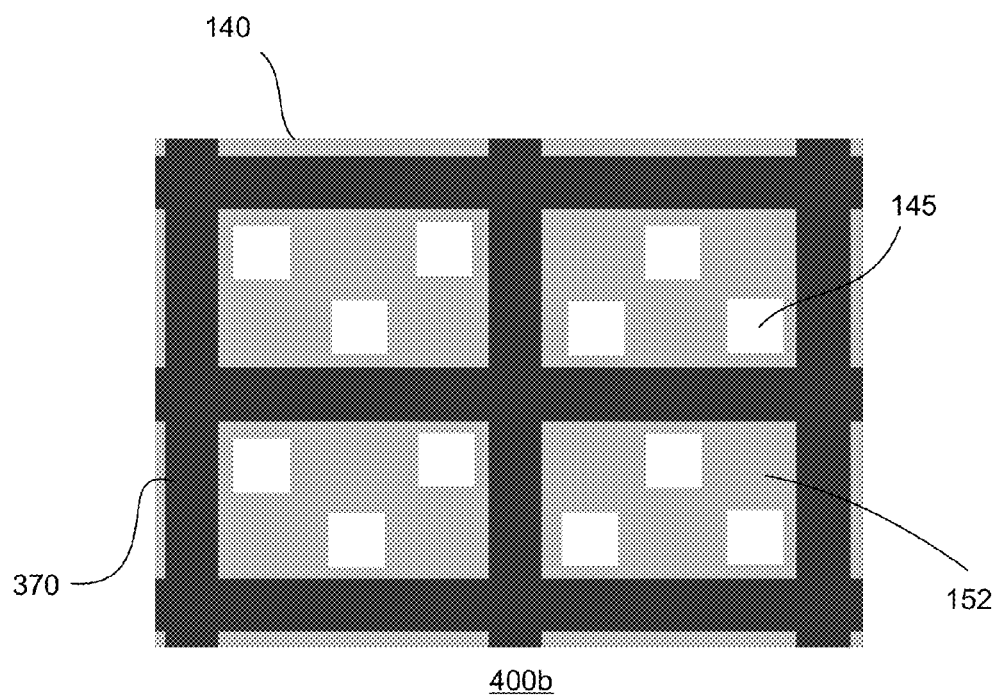

FIGS. 4a-b show plan views of another embodiment of cheesing having different densities in wide metal lines used in crack stops. Referring to FIGS. 4a-b, a plan view of a portion of a metal line 140 is shown. The metal line, for example, may be a wide metal line of a crack stop. The metal line includes dielectric posts 145 which form a cheesing pattern. The density of the cheesing is sufficient to reduce or prevent delamination caused by the stress of the wide metal lines.

As shown, the metal line includes a non-cheesing area 152 devoid of dielectric posts. For example, non-cheesing area is located between the dielectric posts. The non-cheesing area, in one embodiment, corresponds to where a contact bar 370 is disposed. In one embodiment, the contact bar includes a mesh pattern disposed in spaces between the dielectric posts. The mesh pattern, for example, is similar to the mesh pattern as shown in FIGS. 3a-b. Other contact bar patterns may also be useful. A contact bar forms a continuous non-solid conductive barrier which prevents moisture intrusion and out-gassing and enhances the strength of the crack stop. The contact bar above and below may have a similar or same pattern. Providing contact bars above and below having different patterns may also be useful. The mesh design contact bar, for example, may be disposed at the top metal level of the crack stop. Other configurations of the mesh design contact bar and metal levels may also be useful. In one embodiment, the lines forming the cells may be wider than the lines forming the cells in FIGS. 3a-b. For example, the lines may be about 0.2-0.6 μm wide. Providing other widths for the lines may also be useful.

Referring to FIG. 4a, a dielectric post is disposed within the lines of a cell of the contact bar. For example, the dielectric post is disposed substantially within the lines of a cell and does not come into contact with the lines of the cell. Providing multiple dielectric posts within the lines of a cell may also be useful. For example, three dielectric posts are disposed within the lines of a cell as illustrated in FIG. 4b. As shown, the dielectric posts are disposed substantially within the lines of the cell and do not come into contact with the lines of the cell. Other configurations of the dielectric posts and cells may also be useful.

An experiment was conducted. The experiment includes first and second test cases. The test cases include a crack stop having wide metal lines of 7 μm wide and via bars. In the first test case, the top metal line Mx has 2.4% Dielectric Posts density while the metal line on the level below (Mx-1) has a Dielectric Posts density of 4.4%. The first test case exhibited peeling between metal lines Mx and Mx-1. As for the second test case, the top metal line Mx has 15% cheesing density while the metal line on the level below (Mx-1) has a cheesing density of 24.9%. The second test case exhibited no peeling between metal lines Mx and Mx-1. Clearly, from the above experiment, providing a cheesing density in wide metal lines above a lower threshold to reduce stress generated reduces or prevents peeling.

As described, the dielectric cheesing is provided in wide metal lines of a crack stop. In other embodiments, dielectric cheesing may be provided in any metal lines, such as those used for interconnects, which stress may result in delamination. For cheesing in interconnects, they are disposed in non-contact regions.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

What is claimed is:

1. A semiconductor device comprising:
a substrate comprises a plurality of metal layers; and
dielectric posts disposed in the metal layers, wherein the metal layers comprise wide metal lines, the dielectric posts extend the thickness of the wide metal lines and the density of the dielectric posts in the metal layers is equal to about 15-25%.

2. The semiconductor device of claim 1 further comprising via bar disposed in between adjacent metal layers.

3. The semiconductor device of claim 2 wherein the metal layers are disposed in a crack stop region.

4. The semiconductor device of claim 3 wherein the via bar comprises a mesh design or a straight line design.

5. The semiconductor device of claim 4 wherein the mesh design comprises a series of intersecting first lines in a first direction along a width of the metal line and second lines in a second direction along a length of the metal line and the intersections of the first and second lines form a plurality of cells.

6. The semiconductor device of claim 1 wherein the wide metal lines are about 4.5-7 μm wide.

7. The semiconductor device of claim 1 wherein the wide metal lines are wider than about 7 μm wide.

8. The semiconductor device of claim 1 wherein the dielectric posts comprise a dielectric material.

9. The semiconductor device of claim 5 wherein at least one of the dielectric posts is disposed within lines of a cell of the via bar.

10. The semiconductor device of claim 4 wherein the dielectric posts do not come into contact with the via bars above and below the wide metal lines.

11. A semiconductor device comprising:
a substrate comprises a plurality of metal levels having metal layers disposed in a crack stop region; and
dielectric posts disposed in the metal layers, wherein the metal layers comprise wide metal lines, the dielectric posts extend the thickness of the wide metal lines and the density of the dielectric posts in the metal layers is equal to about 15-25%.

12. The semiconductor device of claim 11 further comprising via levels disposed in between adjacent metal levels.

13. The semiconductor device of claim 12 wherein via bars are disposed in the via levels.

14. The semiconductor device of claim 13 wherein the via bars comprise a mesh design or straight line design.

15. The semiconductor device of claim 14 wherein the mesh design comprises a series of intersecting first lines in a first direction along a width of the metal line and second lines in a second direction along a length of the metal line and the intersections of the first and second lines form a plurality of cells.

16. The semiconductor device of claim 11 wherein the wide metal lines are about 4.5-7 μm wide.

17. The semiconductor device of claim 11 wherein the dielectric posts comprise a dielectric material.

18. The semiconductor device of claim 15 wherein at least one of the dielectric posts is disposed within lines of a cell of the via bar.

19. The semiconductor device of claim 14 wherein the dielectric posts do not come into contact with the via bars above and below the wide metal lines.

20. A semiconductor device comprising:
- a substrate prepared with circuit components formed thereon, the substrate having a crack-stop region disposed in a peripheral region of the circuit components;
- a plurality of metal layers disposed in the crack-stop region; and
- dielectric posts disposed in the metal layers, wherein the metal layers comprise wide metal lines, the dielectric posts extend the thickness of the wide metal lines and the density of the dielectric posts in the metal layers is equal to about 15-25%.

* * * * *